United States Patent
Washeleski et al.

(10) Patent No.: US 9,480,143 B2
(45) Date of Patent: Oct. 25, 2016

(54) MOTOR CONTROL DEVICE

(71) Applicant: UUSI, LLC, Reed City, MI (US)

(72) Inventors: John Washeleski, Cadillac, MI (US); Edward Cox, Marion, MI (US); Curtis M. Lizotte, Tustin, MI (US)

(73) Assignee: UUSI, LLC, Reed City, MI (US)

( * ) Notice: Subject to any disclaimer, the term of this patent is extended or adjusted under 35 U.S.C. 154(b) by 249 days.

(21) Appl. No.: 14/049,780

(22) Filed: Oct. 9, 2013

(65) Prior Publication Data

US 2015/0098192 A1 Apr. 9, 2015

(51) Int. Cl.
*H05K 1/00* (2006.01)
*H05K 1/02* (2006.01)
*H05K 7/20* (2006.01)
*H05K 5/00* (2006.01)

(52) U.S. Cl.
CPC .......... *H05K 1/0206* (2013.01); *H05K 5/0047* (2013.01); *H05K 7/20854* (2013.01)

(58) Field of Classification Search
CPC .... H05K 1/02; H05K 1/0203; H05K 1/0206; H05K 7/14; H05K 7/20; H05K 5/00
USPC ........ 361/714, 720–722, 724, 726, 728–732, 361/736, 740, 748, 752; 307/91; 174/35; 29/831
See application file for complete search history.

(56) References Cited

U.S. PATENT DOCUMENTS

| | | | |
|---|---|---|---|
| 6,226,183 B1 * | 5/2001 | Weber ................. | H01L 23/3677 165/185 |
| 6,400,044 B1 * | 6/2002 | Lohberg ............... | H05K 9/0066 174/359 |
| 6,877,488 B2 | 4/2005 | Washeleski et al. | |
| 7,055,505 B2 | 6/2006 | Washeleski et al. | |
| 7,093,485 B2 | 8/2006 | Newman et al. | |
| 7,377,253 B2 | 5/2008 | Washeleski et al. | |
| 7,530,269 B2 | 5/2009 | Newman et al. | |
| 2009/0187327 A1 | 7/2009 | Grant et al. | |
| 2011/0292624 A1 * | 12/2011 | Tanaka .................. | H05K 5/006 361/752 |
| 2013/0033823 A1 * | 2/2013 | Nagashima ............ | B60T 7/042 361/714 |
| 2013/0058044 A1 * | 3/2013 | Watanabe ............. | H05K 5/006 361/714 |

FOREIGN PATENT DOCUMENTS

| | | | | |
|---|---|---|---|---|
| DE | 102012203634 A1 * | 9/2013 | ............ | B60R 16/02 |
| WO | 2008067622 A2 | 6/2008 | | |

* cited by examiner

*Primary Examiner* — Courtney Smith
*Assistant Examiner* — Zhengfu Feng
(74) *Attorney, Agent, or Firm* — Howard & Howard Attorneys PLLC

(57) ABSTRACT

An illustrative example motor control device includes a printed circuit board including electronics for motor control. At least one connector is associated with the electronics. The connector is configured for communicating at least one of control signals or power to a motor. A housing includes a first portion configured to receive the printed circuit board and cover over a first side of the printed circuit board. A second portion of the housing is configured to provide access to the at least one connector from outside of the housing. The second portion of the housing inhibits exposure of the printed circuit board to outside contaminants. A third portion of the housing is configured to cover over a second side of the printed circuit board. At least one heat transfer element on at least one of the housing or the printed circuit board facilitates heat transfer from the printed circuit board to the housing.

21 Claims, 4 Drawing Sheets

MOTOR CONTROL DEVICE

BACKGROUND

Automotive vehicles typically include an internal combustion engine that utilizes the chemical energy available from fuel to propel the vehicle. Most vehicle fuel supply arrangements include a storage tank, at least one fuel rail including fuel injectors for dispensing the fuel into the engine and a pump that delivers the fuel from the tank to the fuel rail. Most fuel pumps are powered by an electric motor. Traditionally, the fuel pump motor was controlled to operate at a single speed. A variety of techniques for varying the speed of fuel pump motor operation have been proposed to address the inefficiencies associated with single-speed arrangements. One challenge associated with such proposed techniques is how to realize the control function through an efficient and cost-effective controller.

SUMMARY

An illustrative example motor control device includes a printed circuit board including electronics for motor control. At least one connector is associated with the electronics. The connector is configured for communicating at least one of control signals or power to a motor. A housing includes a first portion configured to receive the printed circuit board and cover over a first side of the printed circuit board. A second portion of the housing is configured to provide access to the at least one connector from outside of the housing. The second portion of the housing inhibits exposure of the printed circuit board to outside contaminants. A third portion of the housing is configured to cover over a second side of the printed circuit board. At least one heat transfer element on at least one of the housing or the printed circuit board facilitates heat transfer from the printed circuit board to the housing.

The various features and advantages of at least one disclosed example embodiment will become apparent to those skilled in the art from the following detailed description. The drawings that accompany the detailed description can be briefly described as follows.

DETAILED DESCRIPTION

Figure 1:
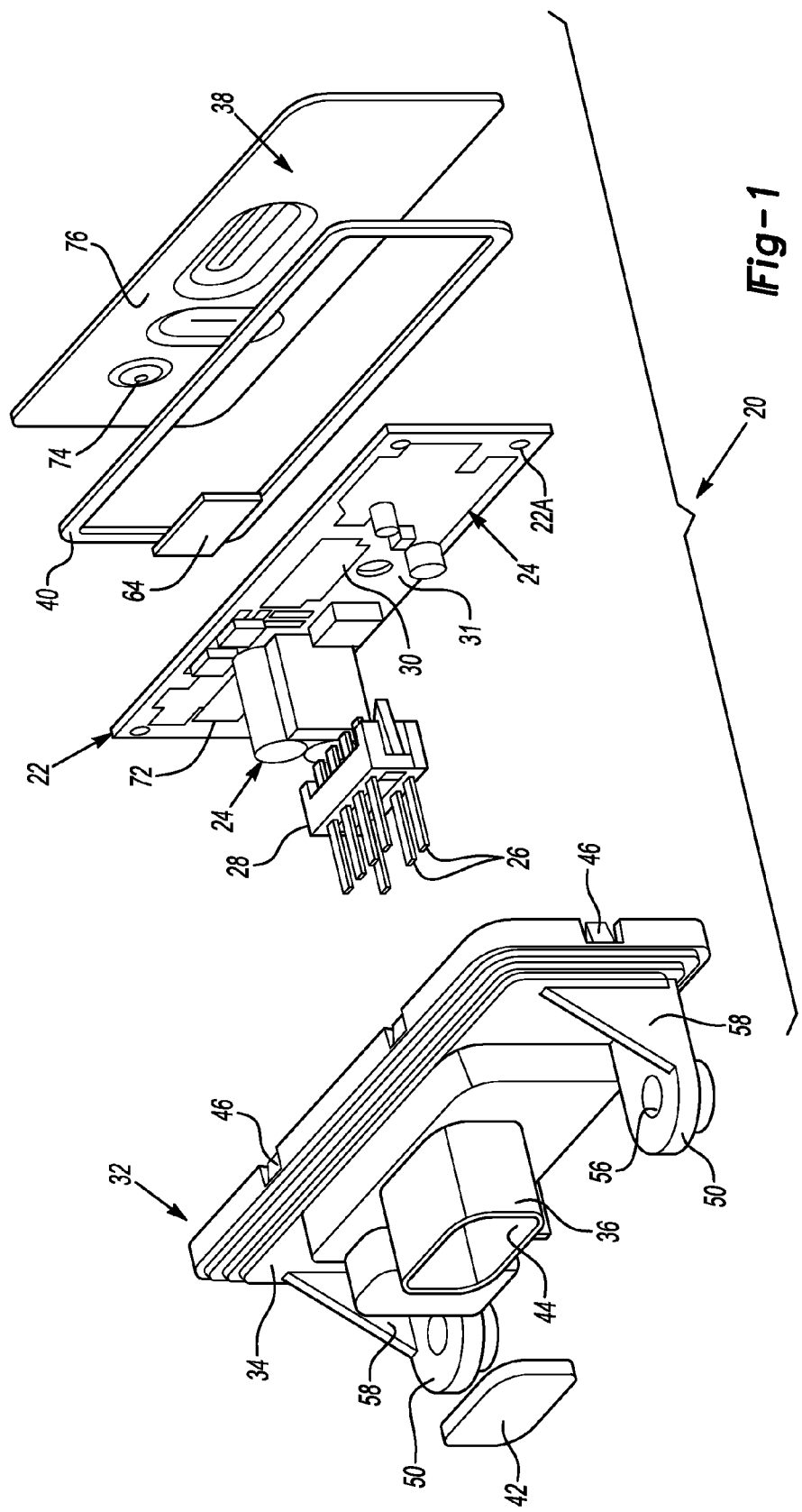
FIG. 1 is an exploded, perspective, schematic illustration of a motor control device designed according to an embodiment of this invention.

FIGS. 1-5 illustrate a motor control device 20 that is useful for controlling motors, such as those used for operating a fuel pump on an automotive vehicle. The device 20 may be utilized for controlling other types of motors.

A printed circuit board 22 comprises a substrate that supports electronics 24 that are configured to operate as a control module for achieving a desired motor control. At least one connector 26 allows for establishing a connection between the electronics 24 and other devices, such as the motor to be controlled and any other devices with which the motor control device 20 will communicate. The connector 26 allows for providing power to the electronics 24, providing information to the electronics 24, for delivering signals containing information from the electronics 24, for delivering power to a motor, or a combination of these. This example includes a carrier 28 that facilitates establishing a connection between the at least one connector 26 and the corresponding portion 30 of the printed circuit board 22. The carrier 28 also facilitates positioning the connector 26 relative to a housing 32.

In the illustrated example, the housing 32 includes a first portion 34, a second portion 36 and a third portion 38. The first housing portion 34 is configured to receive the printed circuit board 22 and cover over a first side 22A (e.g., facing to the left according to the drawing) of the printed circuit board 22. The second portion 36 of the housing 32 is configured to provide access to the connector 26 from outside the housing. The second portion 36 is configured to inhibit exposure of the printed circuit board 22 to contaminants, such as moisture or dirt. In this example, the connector 26 includes terminals that are received within the second portion 36 in a manner that leaves the terminals of the connector 26 exposed but within a shroud established by the second housing portion 36.

The example of FIG. 1 includes an additional seal member 42 that is received within an opening 44 established by the shroud of the second portion 36. With the seal member 42 received within the opening 44, the connector 26 is still accessible and at least partially exposed within the opening 44 (as can be appreciated from FIG. 3, for example). The seal member 42 establishes a sealed interface between the second portion 36 of the housing 32 and at least one of the carrier 28 or the connector 26.

Figure 4:
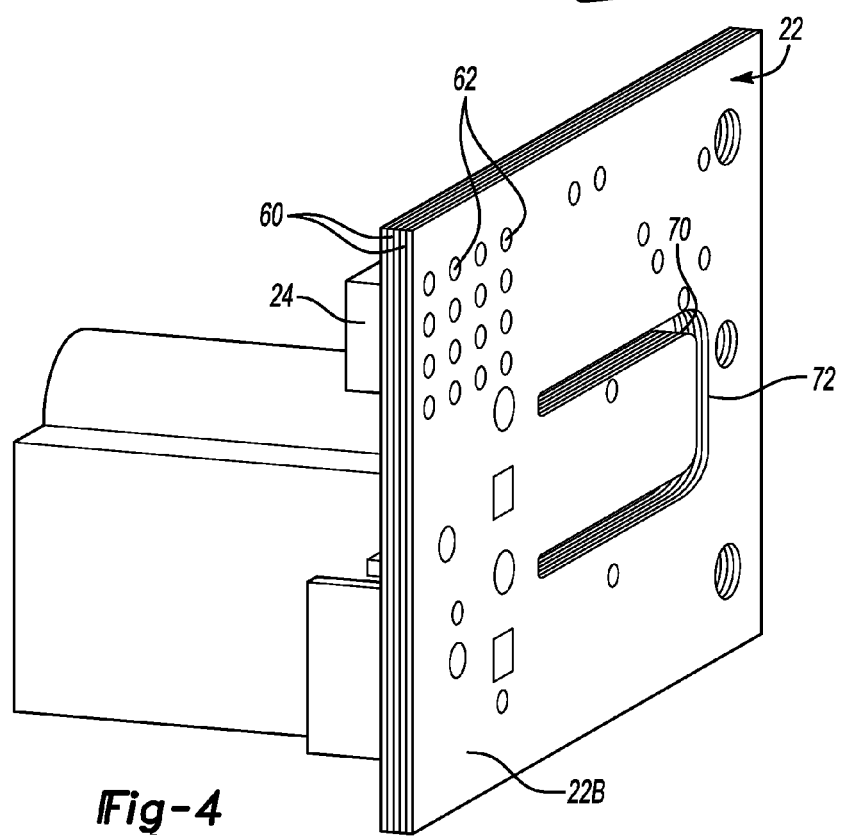
FIG. 4 schematically illustrates selected features of an example embodiment of a printed circuit board.

The example third portion 38 is configured to cover over a second side 22B of the printed circuit board 22 (e.g., a right-facing side in the example of FIG. 1 that is facing forward in FIG. 4). In this example, a seal 40 is situated around a perimeter of an interface between the first housing portion 34 and the third portion 38 of the housing 32 to establish a moisture and contaminant barrier for protecting the printed circuit board 22 and associated electronics 24. The seal 40 may be a pre-formed gasket-type seal or may be a bead of sealant applied to the first or third housing portion, for example, during assembly of the example device 20.

In some examples, the seal 40 is added around the internal perimeter of the first housing portion 34 after the printed circuit board 22 has been appropriately positioned within the first housing portion 34. The seal 40 may comprise an epoxy, silicone or other compressible material that creates a seal between the first housing portion 34 and the third housing portion 38 to prevent any unwanted contaminants from entering into the space within the housing 32. The seal 40 may serve as an adhesive to maintain the third housing portion 38 in place against the first housing portion 34. The adhesive feature of some example seals cooperates with the tabs 46 to maintain the housing in a completed or closed condition. One feature of the tabs 46 is that they hold the third housing portion 38 in place while the sealant cures, which introduces manufacturing economies associated with assembling or manufacturing the device 20.

In another example an encapsulant may be used instead of seal 40 with the encapsulant, or potting, filling the first housing portion 34. A method of filling the housing with encapsulant includes positioning the printed circuit board 22 within the housing portion 34. A nozzle from which potting flows is inserted into a hole located through printed circuit board 22 and then potting is dispensed through the nozzle and through the printed circuit board to the first side 22A of printed circuit board 22 filling the space between the inside surface of housing 34 and printed circuit board 22.

Assembling the example device of FIG. 1 includes placing the carrier 28 and printed circuit board 22 into the first housing portion 34 so that the connector 26 is at least partially exposed and accessible through the opening 44 of the second housing portion 36. The seal 40 is situated on the side of the third portion 38 facing toward the printed circuit board 22. The third portion 38, which comprises a generally planar panel in this example, is snap fit into or onto the first portion 34. As can best be appreciated from FIG. 2, the first portion 34 includes a plurality of securing tabs 46 that hold the third portion 38 of the housing 32 in place and in engagement with the first portion 34. Another example of a securing tab design is shown in FIG. 2A where a ramped step portion 47 on housing first portion 34 is used to retain the tab 48 located on third portion 38 of housing 32.

Figure 2:
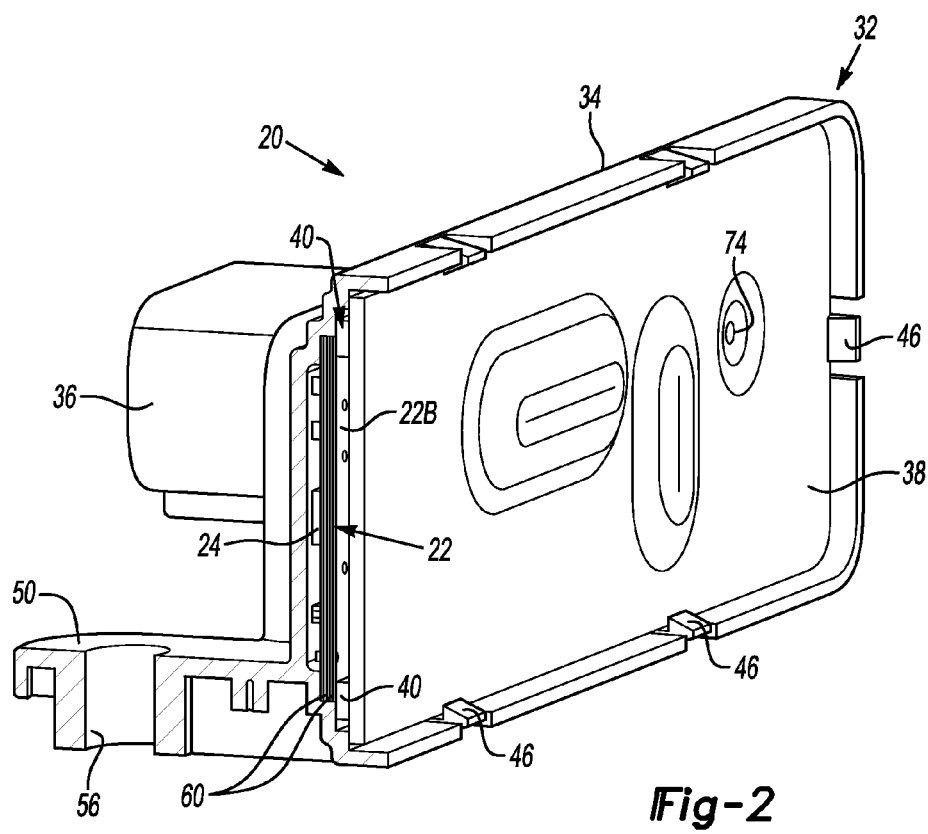
FIG. 2 illustrates selected features of the example embodiment of FIG. 1.
Figure 2A:
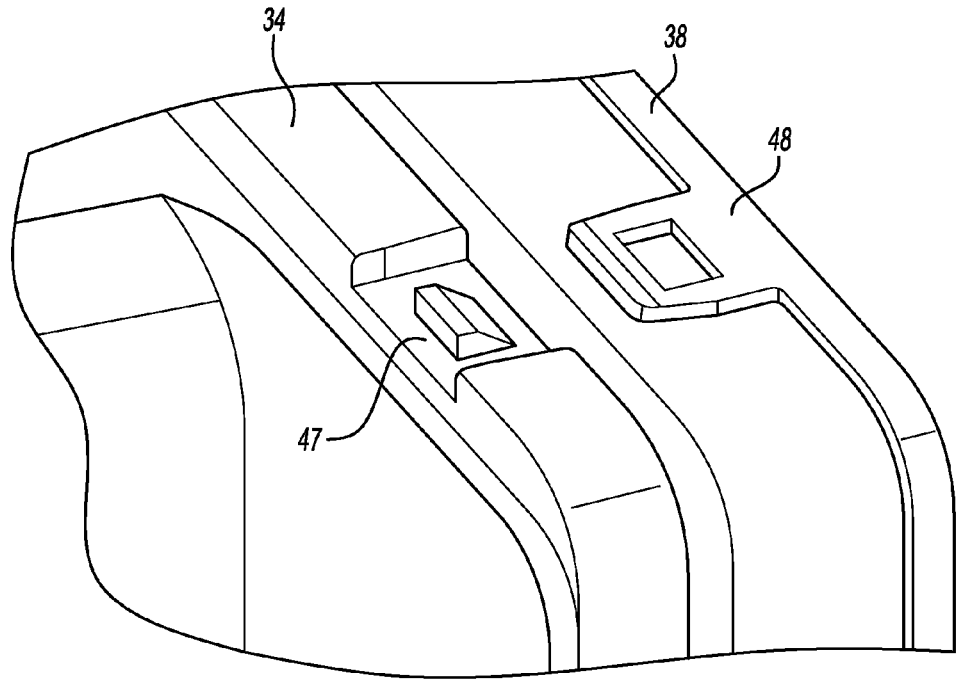
FIG. 2A shows another example embodiment.
Figure 3:
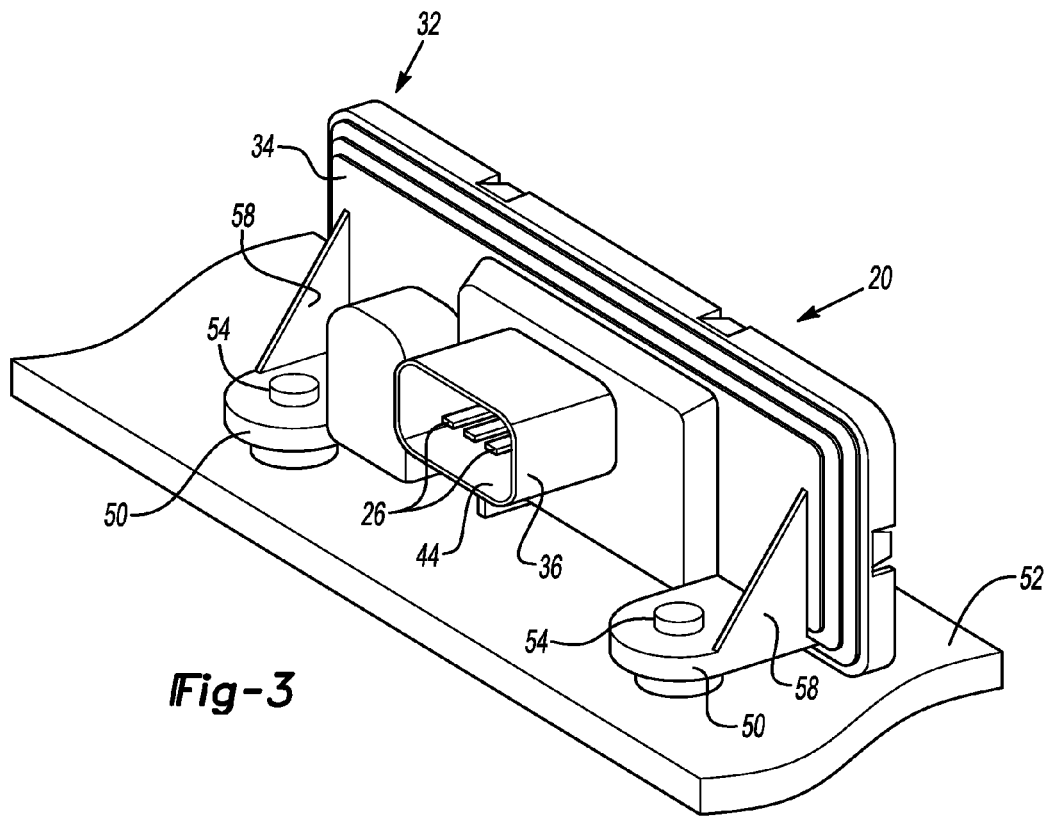
FIG. 3 illustrates the example of FIG. 1 in a fully assembled and mounted condition.

As shown in FIGS. 1-3, the housing 32 includes a plurality of mounting tabs 50 that are configured for mounting the device 20 to a vehicle component schematically shown at 52. Fasteners 54, such as bolts or rivets, are at least partially received through openings 56 in the tabs 50. The fasteners 54 facilitate securing the housing 32 to the vehicle component 52. In some examples, an adhesive may be applied between the tabs 50 and the selected vehicle component.

One aspect of the mounting tabs 50 is that they are positioned far apart from each other and near the lateral edges of the housing 32. The position of the mounting tabs 50 in this example provides ample room for a mating connector and harness to attach to and interface with the connector 26. The position of the mounting tabs 50 in this example additionally provides stability to the housing 32.

Another feature of the example mounting tabs 50 is that they allow for high assembly into narrow or tight cavities, such as on a vehicle underbody along a frame member. The first housing portion 34 in this example is contoured to closely fit over the printed circuit board 22 and the electronics 24. The contour of the first housing portion 34 contributes to maintaining an overall device size that is compact and capable of fitting within narrow or tight cavities on a vehicle, for example. The close arrangement between the inside of the first housing portion 34 and the printed circuit board 22 also provides mechanical support to the printed circuit board 22 and the electronics 24, which allows for reducing vibrational stresses on those components. In the example where an encapsulant is used to fill housing 34 the close arrangement between the inside of the first housing portion 34 and the printed circuit board 22 minimizes the volume of encapsulant needed thereby reducing weight and cost.

One way in which the illustrated example is cost effective is that the housing 32 is molded without terminals for making a connection to a motor or another device. Instead, the connector 26 terminals are associated with the carrier 28 and soldered to the printed circuit board at 30 prior to assembling the printed circuit board 22 into the first portion 34 of the housing 32. In some examples, the carrier 28 is situated within housing 32 to allow for sealant to be applied at the interface between the carrier 28 and the housing 32.

When the entire device is assembled, the opening 44 allows for pressurizing the housing 32 to detect whether there are any leaks through the housing 32, such as might be caused by a defect in the housing 32 or an incorrect position of the seal 40. Once the integrity of the housing 32 is verified in this manner, the seal element 42 may be inserted into the opening 44 to completely seal off the electronics 24 from the environment around the housing 32. The sealing arrangement prevents external environmental contaminants such as moisture from infiltrating the integrated assembly where it may cause damage to the electronics 24.

In the illustrated example, the mounting tabs 50 have associated supporting braces 58, which are molded integrally as a single piece with the first housing portion 34, second housing portion 36 and mounting tabs 50. The supporting braces 58 in this example facilitate maintaining a generally perpendicular relationship between a surface on the mounting tabs 50 that is received against the vehicle component 52 and the first portion of the housing 34. The mounting tabs 50 are also perpendicular to the alignment of the substrate of the printed circuit board 22.

As can be appreciated from FIG. 1, this example includes all of the electronics 24 associated with powering a motor situated on the side 22A of the printed circuit board 22. Heat generated during operation of the electronics 24 is conducted away from the electronic devices through thermally conductive traces 60 on the printed circuit board 22. As shown in FIG. 4, the illustrated example includes a variety of vias 62 that facilitate transferring heat among the traces 60. In one example, the thermally conductive traces 60 comprise copper. The vias 62 may be filled with solder, for example, to increased heat transfer from the side 22A of the printed circuit board 22 to the other side 22B. The third housing portion 38 radiates the heat away from the electronics 24. An alternate example has the printed circuit board having a metal core such as aluminum. This is a well-known method of conducting heat away from a heat producing element.

In the examples, the third housing portion 38 comprises a thermally conductive material, such as aluminum, to assist in drawing heat away from the printed circuit board 22 and the electronics 24. The third housing portion 38 maintains thermal communication with the printed circuit board 22 in this example through a compressible thermal interface material 64 (FIG. 1). When the device 20 is assembled, the compressible material 64 is situated between the side 22B of the printed circuit board 22 and the third housing portion 38. Any heat transferred to the side 22B can be transferred to the third housing portion 38 through the thermal interface material 64. Alternatively, instead of using compressible material 64 in thermal communication with the third housing portion 38, an encapsulant can be used that fills housing portion 38 and is in thermal communication with the third housing portion 38 thereby providing heat transfer from printed circuit board side 22A to the first housing portion 34 and printed circuit board side 22B to the third housing portion 38.

The third housing portion 38 or cover of the housing 32 may also be electrically coupled with at least one electrically conductive trace 70 on the printed circuit board. The illustrated example includes an arrangement for maintaining physical contact between the cover 38 and the trace 70. The example printed circuit board 22 includes a relief 72 that allows for a portion of the printed circuit board 22 to flex or move relative to another portion of the substrate of the printed circuit board 22. In this example, the relief 72 includes a slit or removed section where there is no substrate material. The illustrated example includes a generally U-shaped relief or opening in the printed circuit board substrate at the location of the trace 70.

As can be appreciated from the drawings, the cover 38 is generally planar. The illustrated example includes at least one contact feature 74 configured to maintain an interference fit that establishes (and effectively guarantees) physical contact between the third housing portion 38 and the trace 70. The interior-facing side of the cover 38 includes a generally planar surface 76 and the contact feature 74 comprises a contact surface that protrudes away from the generally planar surface 76. The contact surface on the feature 74 is sized to establish an interference fit between the printed circuit board 22 and the contact surface. The relief 72 on the printed circuit board 22 allows for an interference fit to exist without exerting undesirable amounts of pressure on the printed circuit board.

The relief 72 in this example comprises a gap between the substrate of the printed circuit board 22 and the portion of the substrate associated with the trace 70. The gap allows the portion of the substrate associated with the trace 70 to move relative to the adjacent portion of the substrate to avoid inducing stress on the substrate. In one example, the contact feature 74 comprises a deflected portion of the material of the cover 38 that appears concave from an outside of the housing 32 (as shown in FIG. 2) and appears convex from an inside of the housing 32 (as shown in FIG. 1).

Achieving an interference fit while allowing for a portion of the substrate of the printed circuit board 22 to move relative to other portions allows for reduced tolerance control over the configuration of the contact feature 74 and the portions of the housing 32 that are responsible for the position of the cover 38 relative to the printed circuit board 22. Allowing for reduced tolerance control introduces manufacturing economies, such as reducing manufacturing costs.

Another feature of the trace 70 and the relief 72 in some examples is that they provide a spark gap between the electrically conductive third housing portion 38 and the electronics 24.

Figure 5:
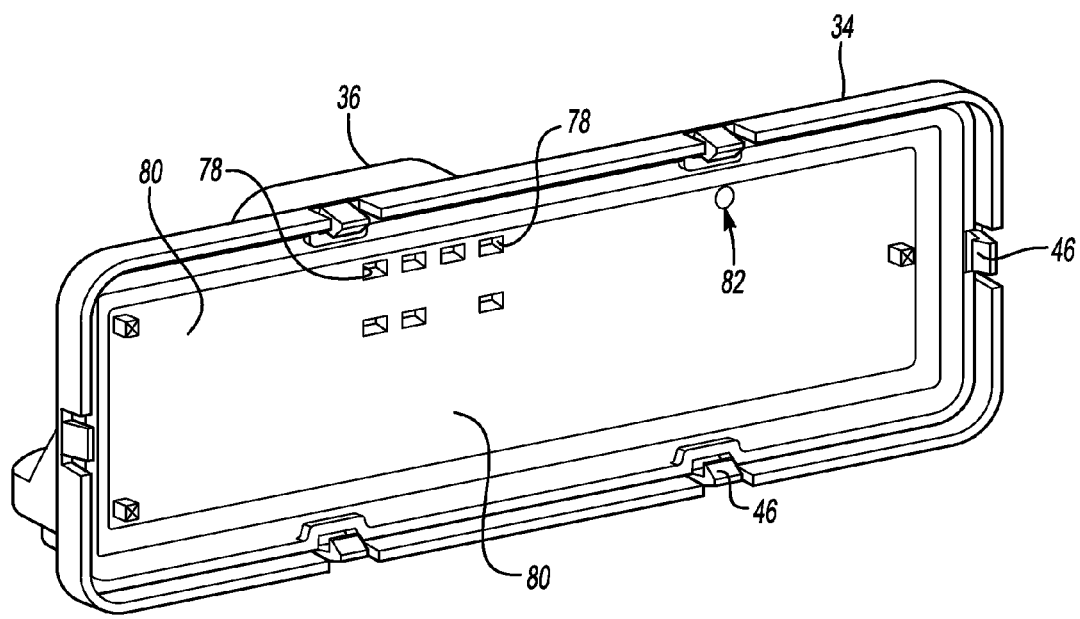
FIG. 5 schematically illustrates an inside surface of a housing portion of the example embodiment.

As shown in FIG. 5, some embodiments include connector terminal openings 78 through an inner wall of the first housing portion 34. Utilizing such openings allows the housing portions 34 and 36 to provide support when mating connectors (external to the device 20) are connected to or removed from the shroud 36. Such support contributes to preventing pressure from being applied to the printed circuit board 22, which may otherwise cause damage.

As mentioned above, sealant may be placed between the carrier 28 and the housing surface. Such sealant may be positioned near the openings 78 to fill any space between those openings and the body of the connector terminals.

In some examples, the device 20 uses a high-side, solid-state switching power device (part of the electronics 24) to deliver power directly to its motor drive output. The switching power device remains in one of a high impedance off state or a low impedance full state. The time it takes the switching power device to transition between these two states is extended to reduce electromagnetic compatibility (EMC) emissions. This is made possible by the effective transfer of thermal energy away from the electronics 24. When the power device switches off, electromotive force (EMF) energy from the inductive motor load is redirected back into the motor via a fly back diode to ground. This recirculation of energy helps to reduce EMC levels inherent in the design.

The example first housing portion 34 includes an internal conductive material layer 80 that contributes to improved EMC performance. The conductive material layer 80 may be realized by spraying or otherwise applying a conductive coating in a layer 80 on the inside of the first housing portion 34. In some examples, a separate layer is inserted into and secured against the internal surface of the housing portion 34. The example of FIG. 5 includes a conductive fastener situated to connect a ground terminal on the printed circuit board 22 to the housing 32.

Additional radiated EMC protection is provided by the electrical coupling between the contact feature 74 on the third housing portion 38. This allows for the cover 38 to serve as a conductive shield to reduce radiated EMC and reduces affects caused by EMC created external from the device 20.

In operation, the motor control device 20 may receive a control signal from the associated vehicle Engine Control Module. This signal is typically a low frequency PWM digital waveform operating around 250 Hz. Other means of communicating the control signal and status to the device 20 could be through an available automotive network such as LIN or CAN. A microprocessor, which is part of the electronics 24, reads the duty cycle of the incoming command signal and then converts the low frequency duty cycle to a higher frequency drive signal. This higher frequency signal, which may be around 20 KHz, is also a PWM signal with a duty cycle proportional to that of the incoming command signal. The drive signal is used to directly turn on and off the high-side switching device that supplies power directly to the motor drive output. The output is then used to directly power an external motor, such as a fuel pump motor. The motor is unaffected by the PWM switching of the drive signal because of the significantly slower response time characteristic of the motor. Instead, the motor experiences the average voltage of the PWM signal duty cycle integrated over time.

The example motor control device 20 includes self-diagnostic capabilities. For example, it is possible for the device to recognize internal faults, such as driver damage, insufficient supply voltage, and invalid command signals. Additionally the device is capable of detecting fault conditions on the motor drive output such as open and shorted load conditions. The signaling used to report internal or external diagnostic information to another device is implemented in some examples as a low frequency PWM digital waveform operating around 100 Hz. By sequencing through preset duty cycles, each defining a specific operating condition, the fuel control module can communicate several status conditions over a short period of time.

The preceding description is illustrative rather than limiting in nature. Variations and modifications to at least one disclosed example may become apparent to those skilled in the art that do not necessarily depart from the essence of the contribution to the art provided by the disclosed example. The scope of legal protection can only be determined by studying the following claims.

The invention claimed is:

1. A motor control device, comprising:
   a printed circuit board including electronics for motor control and at least one electrically conductive trace;
   at least one connector associated with the electronics, the at least one connector for communicating at least one of control signals or power to a motor;
   a housing including a first portion to receive the printed circuit board and to cover over a first side of the printed circuit board, a second portion to provide access to the at least one connector from outside the housing and inhibit exposure of the printed circuit board to contaminants, and a third portion to cover over a second side of the printed circuit board, the third portion having at least one contact feature to maintain an interference fit with the printed circuit board that establishes direct physical contact between the third portion and the at least one electrically conductive trace; and at least one heat transfer element on at least one of the third portion or the printed circuit board that facilitates heat transfer from the printed circuit board to the housing.

2. The device of claim 1, wherein
the second portion includes a shroud around an opening;
the at least one connector is at least partially exposed within the opening; and
the second portion includes a first seal about the at least one connector within the opening.

3. The device of claim 2, wherein
the at least one connector is supported on a carrier;
the carrier is received near a surface in the housing near the opening; and
an interface between the carrier and the surface is sealed.

4. The device of claim 3, comprising a second seal inserted at least partially into the opening such that the second seal establishes a sealed interface between the second portion and the at least one connector.

5. The device of claim 4, comprising a third seal between the second side of the printed circuit board and the second portion of the housing.

6. The device of claim 5, wherein
the first portion of the housing comprises a plurality of tabs that retain the third portion near the first portion; and
the tabs are situated on the first portion to urge the third portion into contact with the third seal.

7. The device of claim 1, wherein
the first portion of the housing comprises a plurality of ramped step portions that retain the third portion near the first portion; and
the third portion of the housing comprising a plurality of tabs situated to mate with the ramped step portions of the first portion and hold the third portion in contact with the first portion.

8. The device of claim 1, wherein the at least one electrically conductive trace comprises a first thermally conductive trace on the printed circuit board.

9. The device of claim 8, wherein
the first thermally conductive trace is supported on the first side of the printed circuit board; and
the at least one heat transfer element comprises a second thermally conductive trace supported on the second side of the printed circuit board and at least one thermally conductive material coupling the first and second thermally conductive traces.

10. The device of claim 9, wherein
the third portion comprises a thermally conductive material; and the third portion is situated relative to the second thermally conductive trace to facilitate heat dissipation away from the printed circuit board through the third portion.

11. The device of claim 1, wherein the at least one heat transfer element comprises a compressible thermal interface material in contact with the third portion and the printed circuit board.

12. A motor control device, comprising:
a printed circuit board including electronics for motor control;
at least one connector associated with the electronics, the at least one connector for communicating at least one of control signals or power to a motor;

a housing including a first portion to receive the printed circuit board and cover over a first side of the printed circuit board, a second portion to provide access to the at least one connector from outside the housing and inhibit exposure of the printed circuit board to contaminants, a third portion to cover over a second side of the printed circuit board;
at least one heat transfer element on at least one of the housing or the printed circuit board that facilitates heat transfer from the printed circuit board to the housing; and
wherein the third portion has a first surface received near the printed circuit board;
the third portion has a second, contact surface protruding from the first surface;
at least the second, contact surface is electrically conductive;
the second, contact surface is received against a corresponding portion of the printed circuit board; and
the corresponding portion of the printed circuit board includes at least one electrically conductive member in contact with the second, contact surface.

13. The device of claim 12, wherein
the printed circuit board includes at least one relief feature adjacent the corresponding portion of the printed circuit board; and
the at least one relief feature to allow the corresponding portion to move or flex relative to another portion of the printed circuit board.

14. The device of claim 13, wherein
the printed circuit board comprises a substrate; and
the at least one relief feature comprises a gap between the substrate of the corresponding portion and an adjacent portion of the substrate, the gap allowing the corresponding portion of the substrate to move relative to the adjacent portion of the substrate.

15. The device of claim 13, wherein the at least one relief feature to accommodate an interference fit connection between the second, contact surface and the corresponding portion of the printed circuit board without inducing stress on another portion of the printed circuit board adjacent the corresponding portion.

16. The device of claim 12, wherein the entire third portion is electrically conductive.

17. The device of claim 1, wherein the first portion includes two mounting tabs to mount the housing on a vehicle component.

18. The device of claim 17, wherein
the printed circuit board comprises a generally planar substrate;
the first portion includes a generally planar panel that is aligned parallel with the substrate; and
the mounting tabs have mounting surfaces to be received against the vehicle component that is aligned at an angle greater than 10° relative to the generally planar panel.

19. The device of claim 18, wherein the mounting surfaces are generally perpendicular to the generally planar panel.

20. A motor control device, comprising:
a printed circuit board including electronics for motor control;
at least one connector associated with the electronics, the at least one connector for communicating at least one of control signals or power to a motor;
a housing including a first portion to receive the printed circuit board and to cover over a first side of the printed circuit board, a second portion to provide access to the at least one connector from outside the housing and inhibit exposure of the printed circuit board to contaminants, and a third portion to cover over a second side of the printed circuit board; and at least one heat transfer element on at least one of the housing or the printed circuit board that facilitates heat transfer from the printed circuit board to the housing;

wherein the first portion includes two mounting tabs to mount the housing on a vehicle component;

wherein the printed circuit board comprises a generally planar substrate;

the first portion including a generally planar panel that is aligned parallel with the substrate and the mounting tabs have mounting surfaces to be received against the vehicle component that is aligned at an angle greater than 10° relative to the generally planar panel; and wherein the mounting tabs have support braces that maintain a desired orientation of the mounting tabs relative to the first portion.

21. A motor control device, comprising:

a printed circuit board including electronics for motor control;

at least one connector associated with the electronics, the at least one connector for communicating at least one of control signals or power to a motor;

a housing including a first portion to receive the printed circuit board and cover over a first side of the printed circuit board, a second portion to provide access to the at least one connector from outside the housing and inhibit exposure of the printed circuit board to contaminants, and a third portion to cover over a second side of the printed circuit board;

at least one heat transfer element on at least one of the housing or the printed circuit board that facilitates heat transfer from the printed circuit board to the housing; and wherein the second portion comprises an opening to facilitate pressurizing the housing when the first and second portions are secured together to detect whether there are any leaks through the housing.

* * * * *